(12) United States Patent
Skahill et al.

(10) Patent No.: US 6,198,305 B1
(45) Date of Patent: Mar. 6, 2001

(54) REDUCED AREA PRODUCT-TERM ARRAY

(75) Inventors: Kevin B. Skahill, San Jose; Christopher W. Jones, Pleasanton, both of CA (US)

(73) Assignee: Cypress Semiconductor Corp., San Jose, CA (US)

(*) Notice: Subject to any disclaimer, the term of this patent is extended or adjusted under 35 U.S.C. 154(b) by 0 days.

(21) Appl. No.: 09/046,960

(22) Filed: Mar. 24, 1998

(51) Int. Cl.[7] .................................................. H03K 19/177
(52) U.S. Cl. ................................ 326/41; 326/41; 326/38; 326/39; 326/40
(58) Field of Search ................................ 326/41, 40, 39, 326/38

(56) References Cited

U.S. PATENT DOCUMENTS

| | | | |
|---|---|---|---|
| 4,447,894 | 5/1984 | Imamura | 365/219 |
| 4,667,310 | 5/1987 | Takada | 365/154 |
| 4,871,930 | 10/1989 | Wong et al. | 307/465 |
| 5,216,636 | 6/1993 | Runaldue | 365/230.05 |
| 5,652,529 * | 7/1997 | Gould et al. | 326/93 |
| 5,670,896 | 9/1997 | Diba et al. | 326/40 |
| 5,691,653 | 11/1997 | Mendel | 326/39 |
| 5,764,080 * | 6/1998 | Huang et al. | 326/41 |
| 5,966,027 * | 10/1999 | Kapusta et al. | 326/39 |

* cited by examiner

Primary Examiner—Michael Tokar
Assistant Examiner—V. Tan
(74) Attorney, Agent, or Firm—Christopher P. Maiorana, P.C.

(57) ABSTRACT

A product-term array that may allow for the implementation of product terms requiring less silicon area than conventional designs. The product terms may also have a shorter propagation delay when compared with conventional designs. A multiplexer, which may be programmed with a configuration bit or signal, may select the polarity of an input signal to the product-term array. Duplicating a number of the initial inputs to the array may accommodate particular design constraints that may require both polarities (i.e., both positive and negative) of a given signal or set of signals. Even with the duplication of certain inputs, the total number of product-term inputs to the array will generally be reduced when compared with conventional designs, that duplicate the polarity of every input internally to the array.

15 Claims, 5 Drawing Sheets

REDUCED AREA PRODUCT-TERM ARRAY

FIELD OF THE INVENTION

The present invention relates to product-term arrays generally and, more particularly, to reduced area product-term arrays.

BACKGROUND OF THE INVENTION

A complex programmable logic device (CPLD) has a number of logic blocks each containing a number of individual programmable macrocells. CPLDs can be easily programmed by engineers in the field and later erased and re-programmed. This allows the designer to make any changes to their system very late in the development cycle, thus realizing a competitive design advantage.

Product-term arrays inside a CPLD are created by providing both a positive and negative polarity of a number of signals that are presented as inputs to the product-term array. FIG. 1 illustrates a product-term array 10 having such a configuration. The product-term array 10 generally comprises a number of inputs 12a–12n and a number of outputs 14a–14n. Each of the inputs 12a–12n is presented to one of a number of buffers 16a–16n. Each of the buffers 16a–16n presents both a true and a complement output of the signal received at the respective input 12a–12n. For example, the buffer 16a has a true output 18a and a complement output 20a. The outputs 18a–18n and 20a–20n are presented to a number of product-term input lines 22a–22n and 24a–24n, respectively. The product-term input lines 22a–22n and 24a–24n are extended in a vertical direction by a number of vertical lines 30a–30n. The vertical lines 30a–30n generally cross a number of product-term lines 32a–32n, which are generally presented to a number of logic gates 34a–34n. The logic gates 34a–34n generally present signals to the outputs 14a–14n.

The disadvantages of providing both the positive and negative polarities (i.e., the true and complement signals) of each input signal 12a–12n include (i) an increased area needed to implement the outputs 22a–22n and 24a–24n for each of the buffers 16a–16n and (ii) longer overall propagation delays due to the increased length of the product-term lines 32a–32n. By increasing the length of the product-term lines 32a–32n, additional silicon die area is required. An increased capacitance on the product-term lines 32a–32n and the product-term input lines 22a–22n (and 24a–24n) increases the propagation delays through the product-term array 10.

SUMMARY OF THE INVENTION

The present invention concerns a product-term array that may allow for the implementation of product terms requiring less silicon area than conventional designs. The product terms may also have a shorter propagation delay when compared with conventional designs. A multiplexer, which may be programmed with a configuration bit or signal, may select the polarity of an input signal to the product-term array. Duplicating a number of the initial inputs to the array may accommodate particular design constraints that may require both polarities (i.e., both positive and negative) of a given signal or set of signals. Even with the duplication of certain inputs, the total number of product-term inputs to the array will generally be reduced when compared with conventional designs that duplicate the polarity of every input internally to the array.

The objects, features and advantages of the present invention include providing a product-term array that (i) reduces the silicon area required for implementation, (ii) reduces the propagation delays through the product-term array, (iii) provides a similar logic capability as a conventional product-term array, and (iv) allows AND-terms to be created from signals or inputs to the array.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 2:
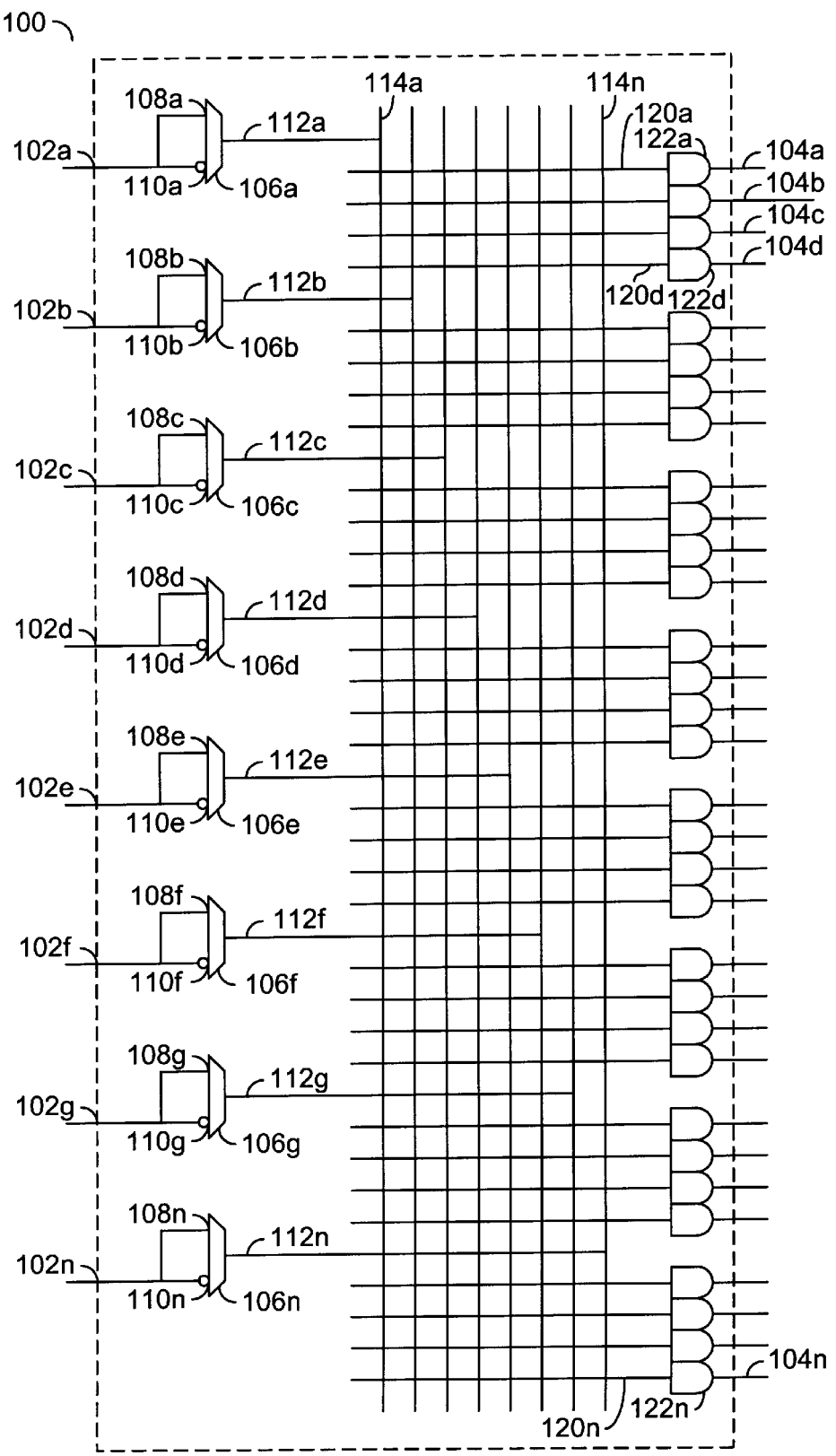
FIG. 2 is a circuit diagram of a product-term array illustrating a preferred embodiment of the present invention.

Referring to FIG. 2, a circuit diagram of a product-term array 100 is shown in accordance with a preferred embodiment of the present invention. The product-term array 100 includes a number of inputs 102a–102n, a number of outputs 104a–104n and a number of multiplexers 106a–106n. Each of the multiplexers 106a–106n generally receives one of a number of true inputs 108a–108n (e.g., inputs having a positive polarity compared with the inputs 102a–102n) and one of a number of complement inputs 110a–110n (e.g., inputs having a negative polarity when compared with the inputs 102a–102n). The inputs 108a–108n generally have a complement polarity to the inputs 110a–110n. The multiplexers 106a–106n may each be connected to one of a number of product-term input lines 112a–112n that may each be extended by one or more of a number of vertical lines 114a–114n. A number of product-term lines 120a–120n generally cross the vertical lines 114a–114n and may or may not provide an electrical connection. Each of the product-term lines 120–120n are generally presented to one of a number of gates (or product terms) 122a–122n. The gates 122a–122n generally present the outputs 104a–104n.

The multiplexers 106a–106n also receive a configuration input (not shown) that may select between either the inputs 108a–108n or the inputs 110a–110n. Each of the multiplexers 106a–106n may have a unique configuration bit. As a result, each of the multiplexers 106a–106n may provide independent polarity control of the signals presented to the product-term input lines 112a–112n. Since a multiplexer 106a–106n is generally provided for each of the inputs 102a–102n presented to the product-term array 100, either the positive or negative polarity of the input signal may be propagated into the product-term array 100. An example of such a polarity selection multiplexer may be found in co-pending U.S. application Ser. No. 08/626,043, which is hereby incorporated by reference in its entirety. The additional delay added by the multiplexers 106a–106n is generally less than or equal to the delay provided by the buffers 16a–16n described in connection with FIG. 1.

Figure 1:
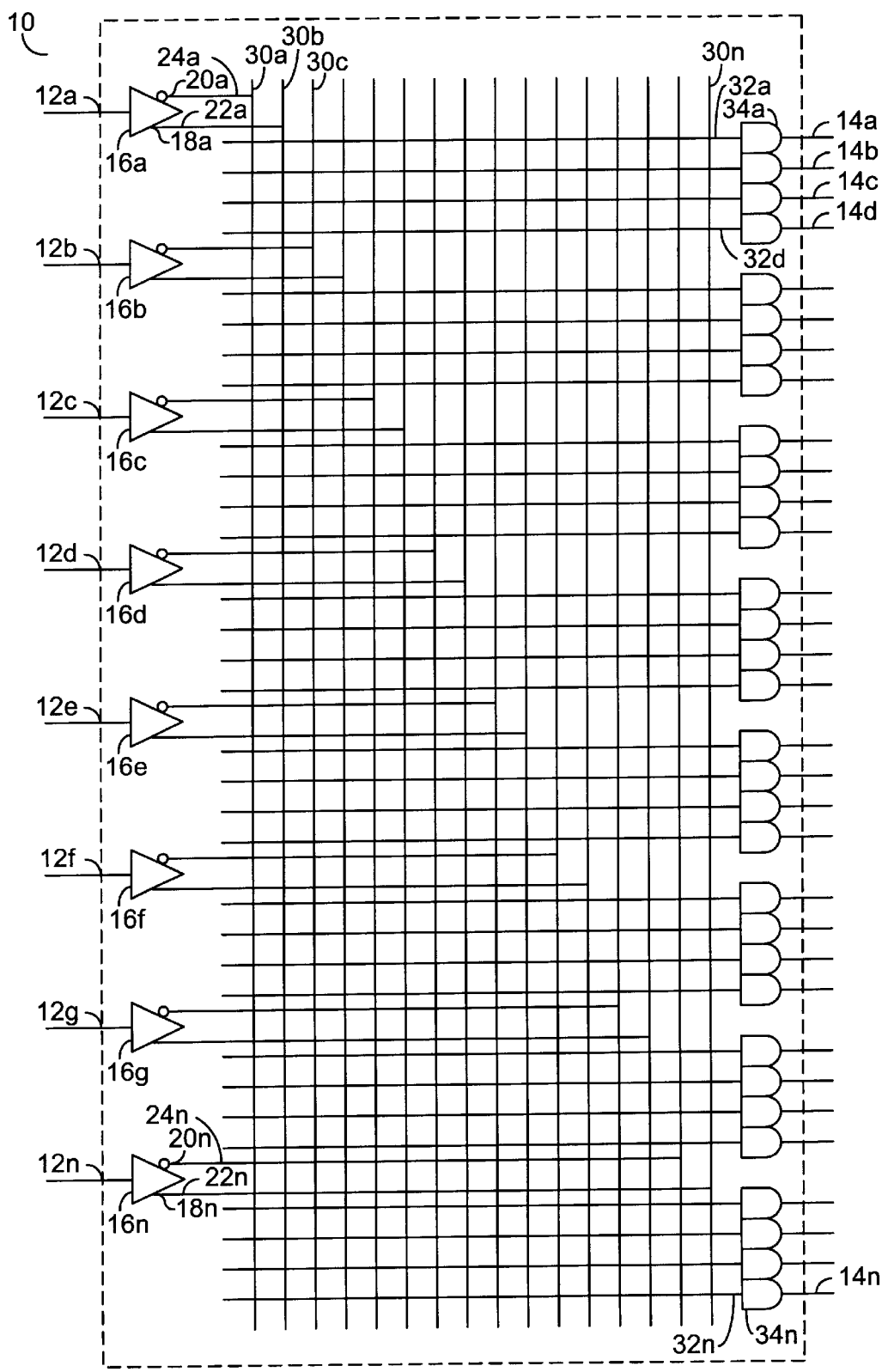
FIG. 1 is a circuit diagram illustrating a conventional product-term array.

In general, for a given number of inputs 102a–102n, half the number of product-term input lines 112a–112n may be required when compared with the example described in connection with FIG. 1. To accommodate the use of both a positive and negative polarity on the single product-term input lines 112a–112n, additional inputs to the product-term array 100 may be provided. For example, if both polarities of a particular signal are required, the signal may be presented (by the programmable interconnect matrix to be described in connection with FIG. 5) to both the inputs 102a and 102b. In such an example, the multiplexer 106a may present the true version of the input to the product-term input line 112a, while the multiplexer 106b may present the complement version of the signal to the product-term input line 112b. Software is generally implemented to route signals requiring only one polarity to one of the inputs 102a–102n and to route signals requiring both polarities to two of the inputs 102a–102n. The software may comprise a medium that stores a series of instructions used to route the opposite polarity signals to the inputs 102a–102n. For one embodiment, the software may be stored in a RAM including SRAM, DRAM, VRAM or other types of RAM memory. For another embodiment, the software may be stored in FLASH memory. For another embodiment, the software may be accessed by a microprocessor, a microcontroller, etc. The number of product terms 122a–122n presented to the outputs 104a–104n, the number of product-term lines 120a–120n and the number of inputs 102a–102n may each be individually adjusted (e.g., increased or decreased) to meet the design criteria of a particular implementation of a product-term array 100.

The reduction of both the number of lines 114a–114n and the size of the product-term input lines 112a–112n may reduce the silicon area required to implement the product-term array 100. As a result, the overall cost in manufacturing a device containing the product-term array 100 may be reduced. In addition, since there is less capacitance on both the product-term input lines 112a–112n and the product-term lines 120a–120n, the overall delay through the product-term array 100 may be reduced.

Design examples that may benefit from the product-term array 100 include multiplexers, shift registers, counters, state machines or other logic functions. When implementing a multiplexer, only one polarity of the input lines is generally required. For example, a 16-to-1 multiplexer may require one polarity for 16 signals and may require two polarities for only the four selection signals. As a result, the multiplexer may be implemented as follows:

$$x = a\_0 * /s\_3 * /s\_2 * /s\_1 * /s\_0 +$$
$$a\_8 * s\_3 * /s\_2 * /s\_1 * /s\_0 +$$
$$a\_4 * /s\_3 * s\_2 * /s\_1 * /s\_0 +$$
$$a\_12 * s\_3 * /s\_2 * /s\_1 * /s\_0 +$$
$$a\_2 * /s\_3 * /s\_2 * s\_1 * /s\_0 +$$
$$a\_10 * s\_3 * /s\_2 * s\_1 * /s\_0 +$$
$$a\_6 * /s\_3 * s\_2 * s\_1 * /s\_0 +$$
$$a\_14 * s\_3 * a\_2 * s\_1 * /s\_0 +$$
$$a\_1 * /s\_3 * /s\_2 * /s\_1 * s\_0 +$$
$$a\_9 * s\_3 * /s\_2 * /s\_1 * s\_0 +$$
$$a\_5 * /s\_3 * s\_2 * /s\_1 * s\_0 +$$

-continued
$$a\_13 * s\_3 * * s\_2 * /s\_1 * s\_0 +$$
$$a\_3 * /s\_3 * /s\_2 * s\_1 * s\_0 +$$
$$a\_11 * s\_3 * /s\_2 * s\_1 * s\_0 +$$
$$a\_7 * /s\_3 * s\_2 * s\_1 * s\_0 +$$
$$a\_15 * s\_3 * s\_2 * s\_1 * s\_0$$

Where s_0, s_1, s_2 and s_3 are the selection signals and a_0–a_15 are the input signals, * represents a logical AND function and + represents a logical OR function.

Thus, the product-term array 100 of the present invention provides a much more efficient solution to implementing a multiplexer.

When implementing a serial shift register, only one polarity for each of the shift register and data bits is generally required. Both polarities are generally only needed for the load signal. Similar to the multiplexer implementation, the present invention provides a more efficient implementation of a shift register with less delay than a conventional product-term array (e.g., the array 10 in FIG. 1).

When implementing a counter, such as a synchronous counter with a synchronous or asynchronous reset, synchronous enable and load, only the true polarity of the counter and data bits and the appropriate active polarity of the reset, enable and load control signals are generally required. As a result, the product-term array 100 may provide a more efficient implementation of a counter than a conventional product-term array.

State machines may require both true and complement state signals. However, when implementing a state machine, the resource limitation is generally found to be in the number of product-terms rather than the number or polarity of inputs. As a result, the present invention may provide a more efficient implementation of a state machine than conventional methods.

Figure 3:
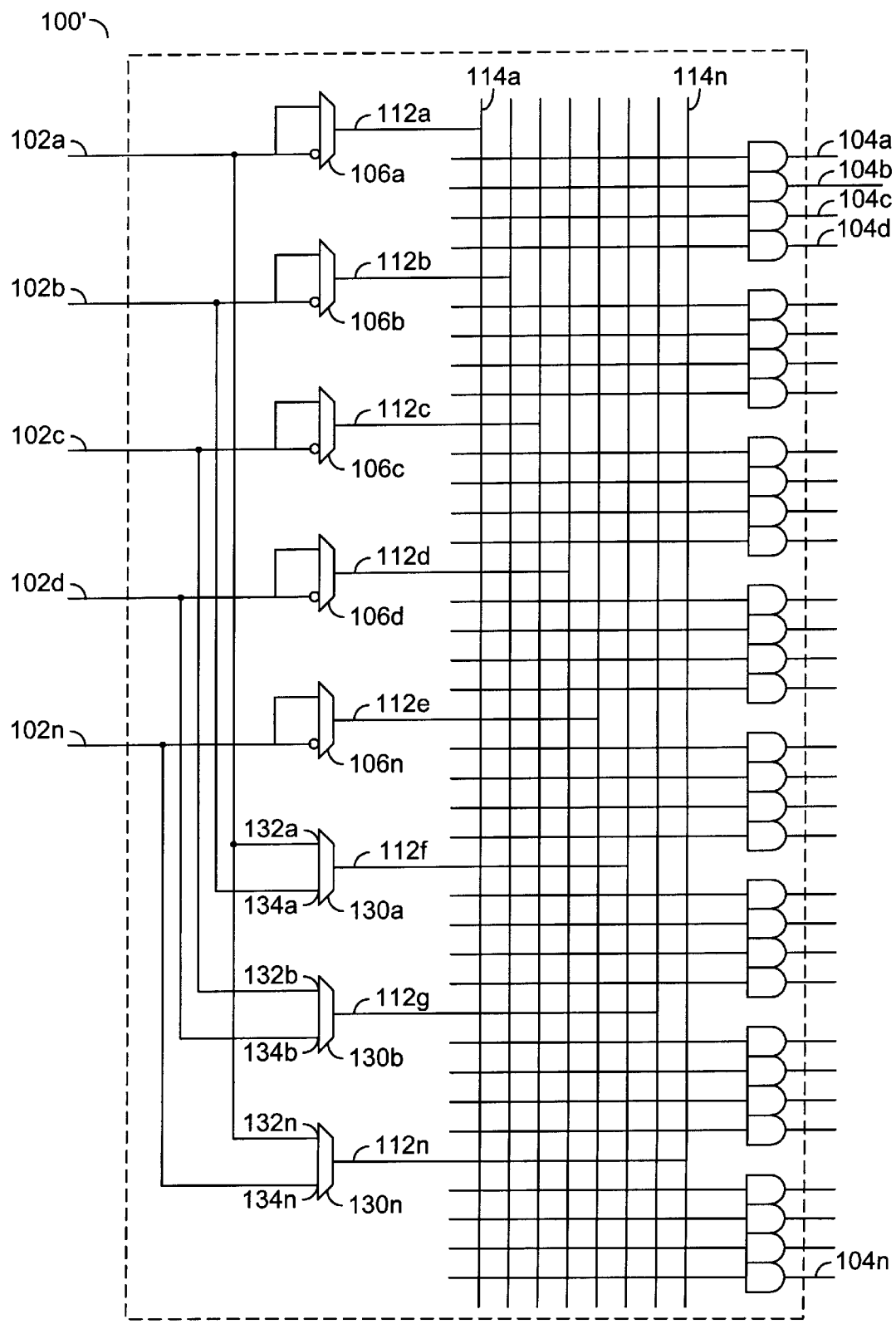
FIG. 3 is a circuit diagram of a product-term array illustrating an alternate embodiment of the present invention.

Referring to FIG. 3, a circuit diagram of a product-term array 100' is shown in accordance with an alternate embodiment of the present invention. The product-term array 100' has similar features as the product-term array 100. Similar features include the multiplexers 106a–106n, the inputs 102a–102n and the outputs 104a–104n. In addition, the product-term array 100' adds a number of multiplexers 130a–130n. The multiplexer 130a is shown receiving an input 132a that may receive the signal from the input 102a and an input 134a that may receive a signal from the input 102b. As a result, the multiplexer 130a may present the true version of either the signal received from the input 102a or 102b to the input product-term line 112f. Similarly, the multiplexer 130b has an input 132b that may receive a signal from the input 102c and an input 134b that may receive a signal from the input 102d. The multiplexer 130b may present the true version of the signal received at the input 102c or 102d to the product-term input line 112g. The multiplexer 130n may have an input 132n that may receive the signal presented at the input 102a and an input 134n that may receive the signal presented at the input 102n. The multiplexer 130n may present the true signal of the input 102a or the true version of the signal 102n to the product-term input line 112n. The particular signals presented to the multiplexers 130a–130n are for illustrative purposes only and may be adjusted accordingly to meet the design criteria of a particular implementation. For example, more than two signals may be presented to one or more of the multiplexers 130a–130n.

Since the multiplexers 130a–130n generally receive the true version of the signals received at the inputs 102a–102n, a reduced number of inputs 102a–102n may result in design applications that require both a true and complement of an input signal. Specifically, if the multiplexer 130a presents the true version of the input 102a, the multiplexer 106a may present the complement version of the signal at the product-term input line 112a. The product-term array 100 reduces the number of inputs 102a–102n and may be useful in design applications that require both the true and complement of a smaller number of input signals. Since the multiplexers 130a–130n each present only a single signal to a respective one of the product-term input lines 112f–112n, the overall number of product-term input lines 112a–112n may still be minimized, similar to the product-term array 100 described in connection with FIG. 2.

Figure 4:
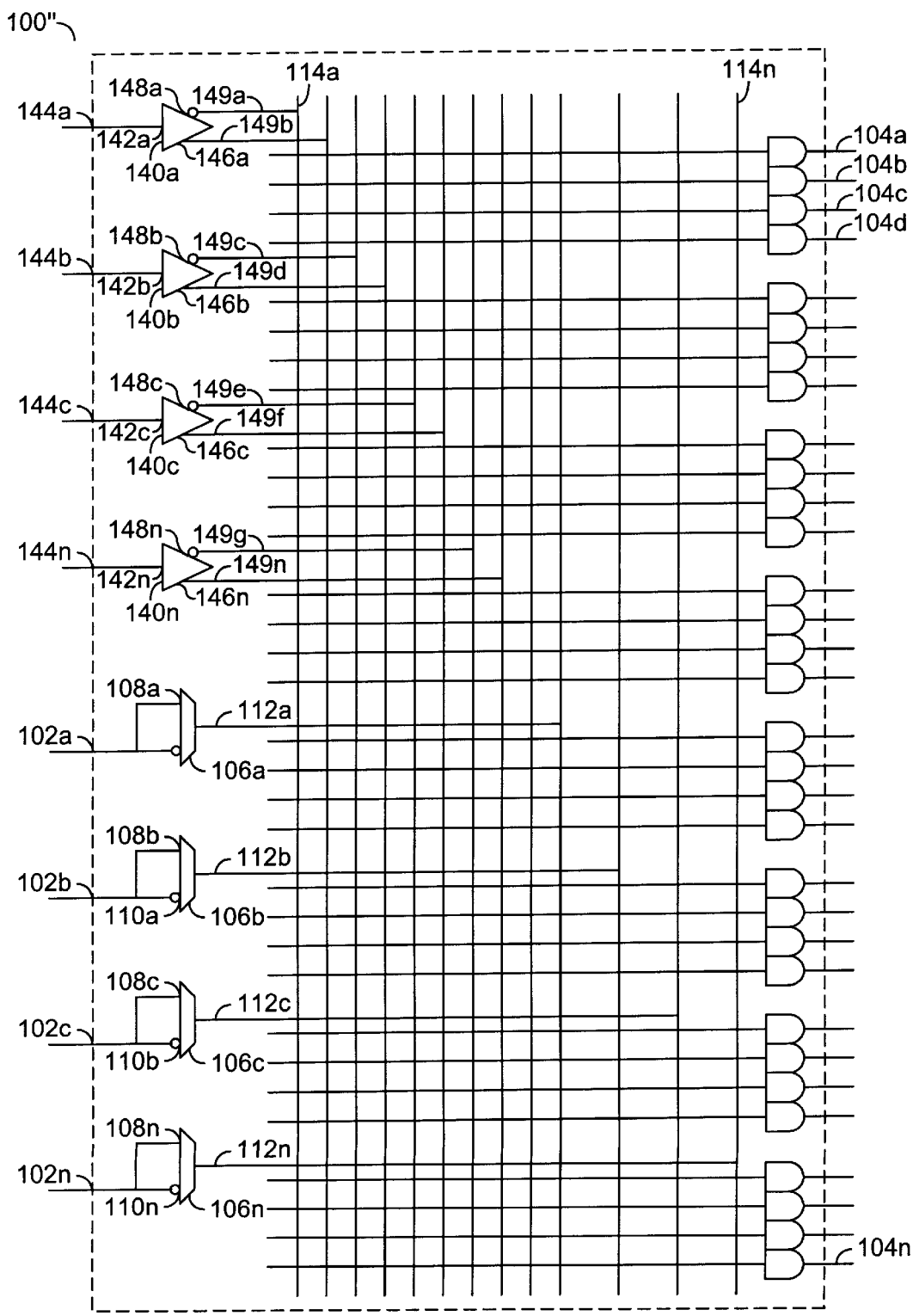
FIG. 4 is a circuit diagram of a product-term array illustrating a second alternate embodiment of the present invention.

Referring to FIG. 4, a circuit diagram of a product-term array 100″ is shown in accordance with an alternate embodiment of the present invention. The product-term array 100″ has similar features as the product-term array 100′. The similar features include the multiplexers 106a–106n, the inputs 102a–102n and the outputs 104a–104n. In addition, the product-term array 100″ adds a number of buffers 140a–140n. The buffer 140a is shown receiving an input 142a that may receive the signal from an input 144a. The buffer 140a may present an output 146a to an input product-term line 149b that may represent a true version of the signal received at the input 144a or an output 148a to an input product-term line 149a that may represent a complement version of the signal received at the input 144a. The buffers 140b–140n have similar connections with one of a number of inputs 144b–144n and a number of outputs 146b–146n and 148b–148n.

The array 100″ may provide flexible solutions where a number of inputs (e.g., 144a–144n) require both the true and complement signals. The multiplexers 102a–102n provide a similar flexibility for signals that require either the true or the complement signals at the product-term input lines 112a–112n. If a number of signals require both a true and complement signal, the hardwiring of the buffers 140a–140n may reduce the overall complexity of the array 100″.

In each of FIGS. 2, 3 and 4, the letter n is used to represent a variable number of a particular device. For example the number of product-term input lines 112a–112n may be a variable number of lines. However, each of the devices (e.g., the multiplexers 106a–106n, the product-term input lines 112a–112n, the product-term lines, etc.) may be independently varied to meet the design criteria of a particular implementation.

Figure 5:
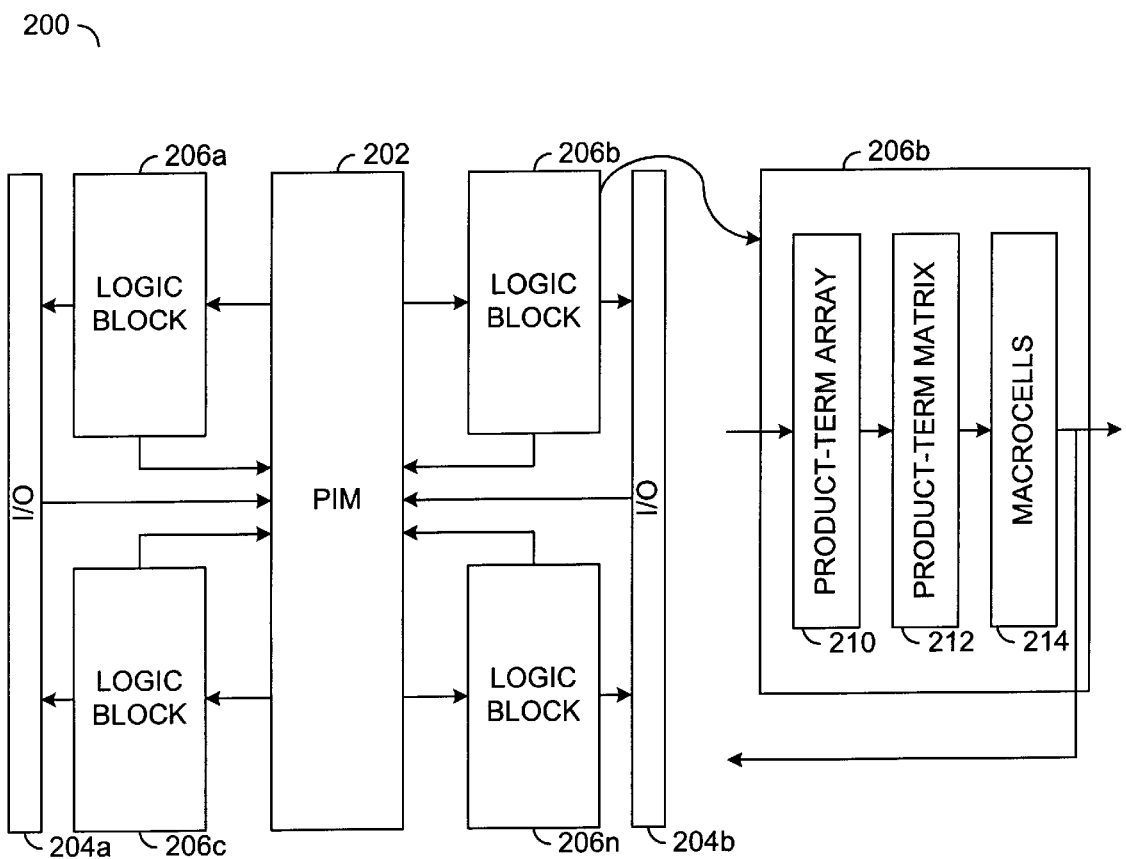
FIG. 5 is a block diagram illustrating the product-term array of the present invention implemented in the context of a programmable logic device or complex programmable logic device (CPLD).

Referring to FIG. 5, a block diagram of a programmable logic device 200 is shown implementing the present invention. The programmable device 200 generally comprises a programmable interconnect matrix 202, a number of input/outputs 204a and 204b, and a number of logic blocks 206a–206n. A more detailed view of the logic block 206b is shown to include a product-term array 210, a product-term matrix 212 and a macrocell block (or circuit) 214. The product-term array 210 generally incorporates the features described in connection with FIGS. 2–4 of the present invention.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   an array having a plurality of input lines each configured to receive an input signal;
   a plurality of first multiplexers, each configured to select either a true state or a complement state of one of a plurality of inputs as said input signal in response to one of a plurality of configuration signals; and
   one or more second multiplexers each configured to present said input signal to one of said input lines in response to (i) a true state of a first one and a true state of a second one of said plurality of inputs and (ii) one of said plurality of configuration signals, wherein said input signals corresponding to a true state and a complement state of one of said plurality of inputs propagate through an equal number of gates.

2. The apparatus according to claim 1, wherein a computer readable medium is configured to present instructions to route a true state into one of said multiplexers and a complement state into another one of said multiplexers.

3. The apparatus according to claim 1, further comprising a programmable interconnect matrix (PIM).

4. The apparatus according to claim 1, implemented in a logic block of a programmable logic device.

5. The apparatus according to claim 4, wherein each of said logic blocks further comprises a product-term matrix.

6. The apparatus according to claim 4, wherein each of said logic blocks further comprises a plurality of macrocells.

7. The apparatus according to claim 1, wherein said array comprises an AND array.

8. The apparatus according to claim 3, further comprising an I/O routing architecture configured to connect the input lines to the programmable interconnect matrix.

9. An apparatus comprising:
   means for receiving into an array one or more input signals;
   means for selecting either a true state or a complement state of a plurality of inputs as said input signals in response to a plurality of configuration signals; and
   means for presenting one or more of said input signals to said receiving means in response to (i) a true state of a first one and a true state of a second one of said plurality of inputs and (ii) a plurality of configuration signals, wherein said input signals corresponding to a true state and a complement state of one of said plurality of inputs propagate through an equal number of gates.

10. A method for generating signals on a plurality of input lines in a programmable device comprising the steps of:
    receiving a plurality of input signals;
    selecting either a true state or a complement state of one of a plurality of inputs as one of said input signals in response to a corresponding one of a plurality of configuration signals; and
    presenting an input signal to one of said input lines in response to (i) a first one and a second one of said plurality of inputs and (ii) one of said plurality of configuration signals, wherein said input signals corresponding to a true state and a complement state of one of said plurality of inputs propagate through an equal number of gates.

11. The method according to claim 10, wherein a computer readable medium is configured to present instructions to route a true state as one of said plurality of input signals and a complement state as another of said input signals.

12. An apparatus comprising:
    an array having a plurality of input lines each configured to receive an input signal;

a plurality of first multiplexers, each configured to select either a true state or a complement state of one of a plurality of inputs as one of said input signals in response to one of a plurality of configuration signals; and one or more second multiplexers each configured to present said input signal to one of said input lines in response to (i) a true state of a first one and a true state of a second one of said plurality of inputs and (ii) one of said plurality of configuration signals.

13. The apparatus according to claim 9, wherein a computer readable medium is configured to present instructions to route a true state and a complement state of one or more of said inputs to either said selecting means or said presenting means.

14. The apparatus according to claim 9, further comprising a programmable interconnect matrix (PIM).

15. The apparatus according to claim 9, implemented in a logic block of a programmable logic device.

\* \* \* \* \*